United States Patent
Tetsuka et al.

(10) Patent No.: US 7,601,241 B2
(45) Date of Patent: Oct. 13, 2009

(54) PLASMA PROCESSING APPARATUS AND PLASMA PROCESSING METHOD

(75) Inventors: Tsutomu Tetsuka, Ibaraki-ken (JP); Kazuyuki Ikenaga, Ibaraki-ken (JP); Tetsuo Ono, Iruma (JP); Motohiko Yoshigai, Hikari (JP); Naoshi Itabashi, Hachioji (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 763 days.

(21) Appl. No.: 10/784,275

(22) Filed: Feb. 24, 2004

(65) Prior Publication Data

US 2005/0133162 A1  Jun. 23, 2005

(30) Foreign Application Priority Data

Dec. 22, 2003  (JP) ............... 2003-425594

(51) Int. Cl.
- *C23C 16/50* (2006.01)
- *C23C 16/505* (2006.01)
- *C23F 1/00* (2006.01)
- *H01L 21/306* (2006.01)
- *C23C 16/06* (2006.01)
- *C23C 16/30* (2006.01)
- *C23C 16/38* (2006.01)
- *C23C 16/32* (2006.01)

(52) U.S. Cl. ............... 156/345.46; 118/723 E; 156/345.45; 156/345.47

(58) Field of Classification Search ............... 118/723 E, 118/723 ME; 156/345.43, 345.44, 345.45, 156/345.46, 345.47
See application file for complete search history.

(56) References Cited

U.S. PATENT DOCUMENTS

| | | | | |
|---|---|---|---|---|
| 4,795,529 A | * | 1/1989 | Kawasaki et al. | ............... 216/37 |
| 6,388,624 B1 | * | 5/2002 | Kazumi et al. | ............... 343/701 |
| 6,391,437 B1 | * | 5/2002 | Kadomura et al. | ....... 428/307.3 |

FOREIGN PATENT DOCUMENTS

| | | |
|---|---|---|
| JP | 2001-23967 | 1/2001 |
| JP | 2001-267299 | 9/2001 |
| JP | 2002-184766 | 6/2002 |
| JP | 2003-168678 | 6/2003 |

OTHER PUBLICATIONS

M.A. Lieberman, Translated by H. Sato, "Principles of Plasma Discharges and Materials Processing", Published Nov. 20, 2001 by ED Research Co., p. 116.

* cited by examiner

*Primary Examiner*—Rudy Zervigon
(74) *Attorney, Agent, or Firm*—Antonelli, Terry, Stout & Kraus, LLP.

(57) ABSTRACT

A plasma processing apparatus having 90% or more of a side wall of an inner wall 101 of a reaction chamber 1 covered with a dielectric 102, and equipped with an earthed conductive member 21a having an area of less than 10% of the side wall area of the inner wall 101 and having a structure to allow direct current from a plasma to flow therein, wherein the DC earth formed of the conductive member 21 is located at a position where floating potential of plasma (or plasma density) is higher than the floating potential of plasma 9 located near a wafer holding electrode 14 where there is relatively large wall chipping.

11 Claims, 7 Drawing Sheets

PLASMA PROCESSING APPARATUS AND PLASMA PROCESSING METHOD

FIELD OF THE INVENTION

The present invention relates to a plasma processing apparatus and plasma processing method that reduce the damage to the inner walls of the reaction chamber that is caused by the application of high frequencies to a substrate to be processed, and that enable stable processing to be performed for a long time.

DESCRIPTION OF THE RELATED ART

Along with the miniaturization and integration of semiconductor devices and with the increase in the variety of component materials used in the devices, the plasma processing apparatuses used for manufacturing the semiconductor devices are required not only to be able to perform highly accurate processes but also to enable stable quantity output and enhanced cleanness. In a plasma etching apparatus, for example, high frequency is applied to the wafer to be processed using reactive gas plasma, according to which the inner walls of the reaction chamber are damaged by ions puttering due to high frequency power, and the inner wall material of the reaction chamber is chemically eroded by the reactive gas. Such sputtering or erosion of the wall material causes the metal contained in the wall material to enter the processed wafer and cause deterioration of the LSI circuit performance, and causes the chemical composition or the manner in which the high frequency is propagated in the reaction chamber to vary gradually, thus making it impossible to perform long-term stable processing. Further, if chemical reaction occurs between the wall material and reaction products, causing contaminants to deposit on the inner walls of the reaction chamber, the deposits that are gradually grown during long term use may fall off from the walls and enter the circuit formed on the wafer as foreign matter, causing increase of percent defective of the products being processed.

In order to cope with this problem, in recent plasma processing apparatuses, the surface of components in the apparatus such as the inner walls of the reaction chamber and the substrate holder are coated with non-conductive (dielectric) material such as alumite (anodized aluminum) that is stable to chemical reaction, or covered with quarts or polymeric material.

However, if the region that generates the plasma is covered with dielectric, the flow of charged particles dispersing from the plasma becomes unstable and the plasma potential is varied thereby, according to which stable processing becomes difficult. Further, the varying potential may cause damage to the wafers being processed. FIG. 6 shows the measured results of the potential waveforms at the inner wall surface of a plasma etching apparatus having a reaction chamber formed of aluminum with the whole inner wall surface being anodized, wherein the measurement is performed using an oscilloscope having its sensor mounted on the inner wall of the anodized aluminum reaction chamber.

On the other hand, as illustrated in FIG. 7 explaining the dielectric coating portion formed on the inner wall surface of the reaction chamber, an alumina coating 102 as dielectric is equivalent to a condenser with a thickness d intervened between a plasma 9 and a reaction chamber inner wall 101 with respect to high frequencies (frequency fHz). Thus, the high frequency can be propagated through the alumina coating and the inner wall functions as earth for the high frequency even with the alumina film coating.

The processing conditions in this example corresponds to a typical etching process, wherein $CF_4$ gas is used as reactive gas and plasma is discharged with a pressure of 2 Pa, while a high frequency of 400 kHz is applied by 140 W to a 12-inch Si wafer. As can be seen from FIG. 6, the potential at the inner wall surface of the chamber is varied at 400 kHz in synchronism with the applied high frequency, and the potential is also varied in a DC-like manner by the high frequency power (bias power). This variation of potential at the inner wall surface is also caused according to various processing conditions, and especially, the DC-like potential variation has no reproducibility and shows unstable behavior according to some discharge conditions. That is, the potential at the surface of the inner wall 101 of the reaction chamber is maintained at negative potential if the applied bias power is low, but is maintained at positive potential if the applied bias power becomes higher. In the case shown in FIG. 6, the DC-like potential variation is, at maximum, over 20 V.

The relationship between the plasma potential near the inner wall of the reaction chamber and the damage to the walls caused by ion sputtering will now be explained with reference to FIG. 8. Regarding the potential of plasma at the front surface of the inner wall of the reaction chamber, a sheath is formed between the plasma and the wall, by which positive ions are accelerated toward the wall. The acceleration energy of ions depend on the plasma potential (ion acceleration potential) V1 at the end of the sheath, wherein if the plasma potential V1 is increased, the acceleration energy of ions is increased, and the amount of damage on the wall surface caused by the ions sputtering the wall is increased. Therefore, if the plasma potential varies for approximately 20 V in a DC-like manner as shown in FIG. 6, the voltage that accelerates the ions from the plasma are increased by 20 V when the wall is sputtered, and as a result, the wall chipping speed is increased.

Further, if such potential variation of plasma occurs, an electric field is induced within the processed wafer surface, causing electrical damage to the circuit formed on the wafer and resulting in deterioration of product property and increase of defective fraction.

In an inductively coupled plasma etching apparatus, there is no electrode serving as a potential reference within the reaction chamber since an induction coil disposed outside the dielectric vacuum window is used to apply high frequency and generate plasma in the chamber, so the plasma potential tends to be varied, causing damage to the circuit formed on the wafer. Thus, an earth point serving as a potential reference was disposed within the plasma processing chamber (refer for example to Patent Document 1). It is disclosed in Patent Document 1 that the disposed earth point is formed of a conductive metal material and can have a protective coating made for example of insulating ceramic. Thus, the disclosure does not consider the DC-like variation of plasma potential, but only assumes the variation of plasma potential of high frequencies that are able to pass through the insulative protective coating formed on the earth point surface. Further, as for the location for disposing the earth point, the disclosure mentions that it can be located at a place in shadow with respect to the plasma generated within the plasma reaction chamber. According to this method, however, the DC-like potential variation is not necessarily stabilized, and if an insulative protective coating is formed on the earth point surface, the DC-like potential variation as shown in FIG. 6 cannot be reduced. As for the location for disposing the earth point, since it is not disposed where the plasma exists in high densities in the plasma reaction chamber, the effect of stabilizing the DC-like variation of the plasma potential is small.

On the other hand, a plasma processing system is disclosed (for example, refer to Patent Document 2) that prevents the variation of plasma potential, comprising an earth electrode made of aluminum alloy as base material and having an alumite layer coating the base material that is disposed around the circumference of the substrate holder, in which the aluminum alloy as base material is exposed in advance at prescribed positions where the alumite coating tends to be damaged by the process, thereby preventing the variation of processing conditions by the alumite coating coming off during the long term use. In such prior-art system, the area from which alumite is chipped away is predetermined, which is the upper end of the earth electrode. The area at which the aluminum alloy base material is exposed corresponds to this area from which the alumite is chipped away, which is 2% of the process wafer area or smaller. Therefore, this prior art disclosure only mentions the effect of suppressing the variation in processing conditions caused by the alumite being chipped away, and does not consider suppressing the potential variation of plasma or reducing the damage of the earth.

In order to prevent the deterioration of properties of the formed LSI circuit during the plasma process, it is very important to reduce the amount of metal impurities chipped away from the inner walls of the reaction chamber and entering the wafer. Therefore, it has become indispensable to cover the inner surface of the reaction chamber with a protective coating made of chemically stable insulating materials. However, if the inner surface of the reaction chamber is covered with insulating protective coating, the plasma becomes unstable, causing damage to the LSI circuits or deteriorating the long-term stability of the process.

In order to solve such problems, an earth point was provided in the processing chamber as disclosed in above-mentioned Patent Document 1, but by simply providing an earth point, only the potential variation of plasma was stabilized, and the problem of the reaction chamber being damaged by the ion sputtering caused by the high frequency applied to the wafer could not be solved. That is, if the earth point is located at the corner of the plasma reaction chamber, the plasma density coming into contact therewith falls and the electric resistance between the plasma near the earth and the earth point becomes large, between which occurs the fall of potential, and the function as earth electrode is deteriorated. Moreover, if a protective coating formed of an insulating material is provided on the earth point surface, the plasma potential cannot be stabilized with respect to DC-like or low-frequency potential variations. Furthermore, the disclosure related to providing the earth point does not consider the effect of reducing the damage to the inner wall of the reaction chamber or to the earth caused by the high frequencies applied to the wafer by providing the earth point.

On the other hand, the method disclosed in Patent Document 2 relates to removing the alumite in advance at the end of the earth in the plasma reaction chamber that tend to be chipped away and effectively reduces the variation of the process in long term, but it but does not reduce the damage to the earth. On the contrary, since the alumite serving as a protective coating is removed from the end portion of the earth formed of aluminum alloy base material and disposed on the sidewall of the electrode mounting the wafer, the aluminum alloy base material is directly exposed to plasma, by which the aluminum is directly subjected to ion sputtering causing impurities to enter the wafer. Furthermore, the reactive gas used in the etching process comes into direct contact with the base material, causing the material to be damaged by chemical reaction and increasing the amount of metal impurities entering the wafer.

In general, the potential generated on the wall surface is distributed so that the potential decreases toward the wall surface as shown in FIG. 8, by which the dispersion of ions is increased. The steady potential difference formed at this time that accelerate ions is theoretically several times the electron temperature (4.7 times in the case of argon plasma), which is approximately several V to over 10 V (refer to Non-Patent Document 1).

However, when high frequencies are applied to the wafer so as to irradiate ions on the wafer being processed, the potential at the inner wall surface varies by the high frequency. When the high frequency power is increased, the potential variation intensity at the inner wall surface is increased thereby, and the energy (V1) of the ions sputtering the inner wall surface is enhanced, according to which the damage to the walls is increased. For example, upon etching an insulating film, ion irradiation with relatively high energy must be performed to accelerate the surface reaction, and a high frequency of approximately 200 W is applied to a wafer with a diameter size of 300 mm. At this time, the maximum-minimum amplitude of potential at the wafer position is around 1000 V, and based on this variation of wafer potential, the plasma potential (V1) near the reaction chamber wall reaches as high as several 10 V at maximum by the high frequency being applied. If the ions are accelerated by this potential variation, the ions sputter the inner wall of the reaction chamber and causes aluminum and other metal elements of the wall material to be mixed into the plasma.

Patent Document 1:
Japanese Patent Laid-Open Application No. 2001-23967
Patent Document 2:
Japanese Patent Laid-Open Application No. 2001-267299
Non-Patent Document 1: "Principles of Plasma Discharges and Materials Processing", M. A. Lieberman, Translated by H. Sato, Published Nov. 20, 2001 by ED Research Co., Page 116

SUMMARY OF THE INVENTION

The present invention aims at solving the problems of the prior art mentioned above. In other words, the object of the present invention is to provide a plasma processing apparatus and plasma processing method capable of reducing the amount of impurities in the reaction chamber without deteriorating the stability of plasma.

In order to solve the above-mentioned problems, the present invention covers 90% or more of the area of the inner wall of the reaction chamber with dielectric, and provides on the inner wall of the reaction chamber a DC earth formed of an earthed conductive member having an area of less than 10% on the inner wall and formed so that direct current flows therein from the plasma. Further, the DC earth is positioned where the floating potential of plasma (or plasma density) is higher than the floating potential of plasma near the substrate holder (wafer holding electrode) where there is relatively intense wall chipping.

According to the present invention, the dielectric is a protective coating formed of insulating ceramic such as carbide, oxide or nitride like SiC, boron carbide and alumite, and the thickness d of the dielectric coating is determined so that, with respect to the relationship between frequency f of the high frequency applied to the substrate and the dielectric constant $\in$ of the dielectric, an impedance per unit area $R = d/(2\pi f \in)$ when the high frequency is propagated by capacity coupling through the dielectric portion is 100 Ω or smaller.

According further to the present invention, a magnetic field generation means is disposed outside the reaction chamber to apply magnetic field to the plasma, and the DC earth is disposed at a position crossing a magnetic line of force that is closer to the substrate holder than a magnetic line of force that crosses the inner wall of the reaction chamber closest to the substrate.

According to the present invention, either a base material of the DC earth or a protective coating disposed on a surface of the DC earth coming into contact with plasma is composed of conductive ceramic, SiC, Al or Al compound.

According to the present invention, when a base material of the DC earth is composed of a non-metallic material such as conductive ceramic, SiC, Al or Al compound, a conductive member having a conductivity of 1 Ωcm or less is disposed on the mounting surface of the DC earth by evaporation, spraying or interposing, thereby reducing the earth resistance of the DC earth.

According to the present structure, even if the inner wall is coated with a chemically stable protective coating so as to reduce the amount of metal impurities generated from the metal inner wall material of the plasma reaction chamber, the plasma near the inner wall is earthed in DC-like manner, so the plasma is prevented from becoming unstable, and the LSI circuits will not be damaged. Further, as shown in FIG. 9, since the DC earth provides an earth at a position where the plasma potential øp is high, the plasma potential at the inner wall portion and at the earth portion of the reaction chamber can be reduced. Thus, the voltage accelerating the ions in the plasma can be cut down, and the wall damage caused by ion sputtering can be suppressed.

That is, with respect to the electrons and ions which are charged particles that constitute the plasma, an electric field pulling back the electrons that have smaller mass and tend to diffuse at high speed is self-generated in the plasma. As a result, a plasma potential (or plasma density) distribution as shown in FIG. 9 is formed in the plasma. The potential of the plasma is highest at the plasma generating portion, and is reduced gradually toward the inner wall of the reaction chamber toward which charged particles diffuse. The difference in potential of the plasma is varied by the difference in the arrangement of the apparatus, the plasma generating system or the discharge gas etc., but in a normal plasma, the energy of the electrons is several eV, and the potential difference generated in the plasma is around several V to several tens of V. Moreover, in general, the plasma density is highest at the plasma generation area and is reduced toward the inner wall of the reaction chamber since plasma is diffused toward the wall. Thus, the position for locating the DC earth where plasma potential is high corresponds to where the plasma density is higher than near the inner wall of the reaction chamber.

Therefore, by disposing the DC earth at a location closer to the plasma generating region (where plasma density is highest) than the position of the earth portion (inner wall of the reaction chamber) or at the inner wall of the reaction chamber where wall sputtering must be suppressed, the plasma potential at the inner wall or at the earth portion where sputtering becomes a problem can be reduced by $\delta V$.

By providing as the protective coating of the inner wall of the reaction chamber an insulating ceramic such as carbide, oxide or nitride like SiC, boron carbide and alumite, and the thickness d of the dielectric coating is determined so that, with respect to the relationship between frequency f of the high frequency applied to the substrate and the dielectric constant $\in$ of the dielectric, an impedance per unit area $R = d/(2\pi f \in)$ when the high frequency is propagated by capacity coupling through the dielectric portion is 100 Ω or smaller, the impedance R of the protective coating is maintained low with respect to high frequencies, so the coating does not deteriorate the function of the earth to high frequencies. As a result, even when the inner wall of the reaction chamber is covered with protective coating, the impedance of the protective coating with respect to the high frequency current flowing into the wall or the earth portion is increased, by which the variation in the plasma potential can be suppressed, and the increase of wall damage caused by ion sputtering can be prevented.

DETAILED DESCRIPTION OF THE PREFERRED EMBODIMENT

Figure 1:
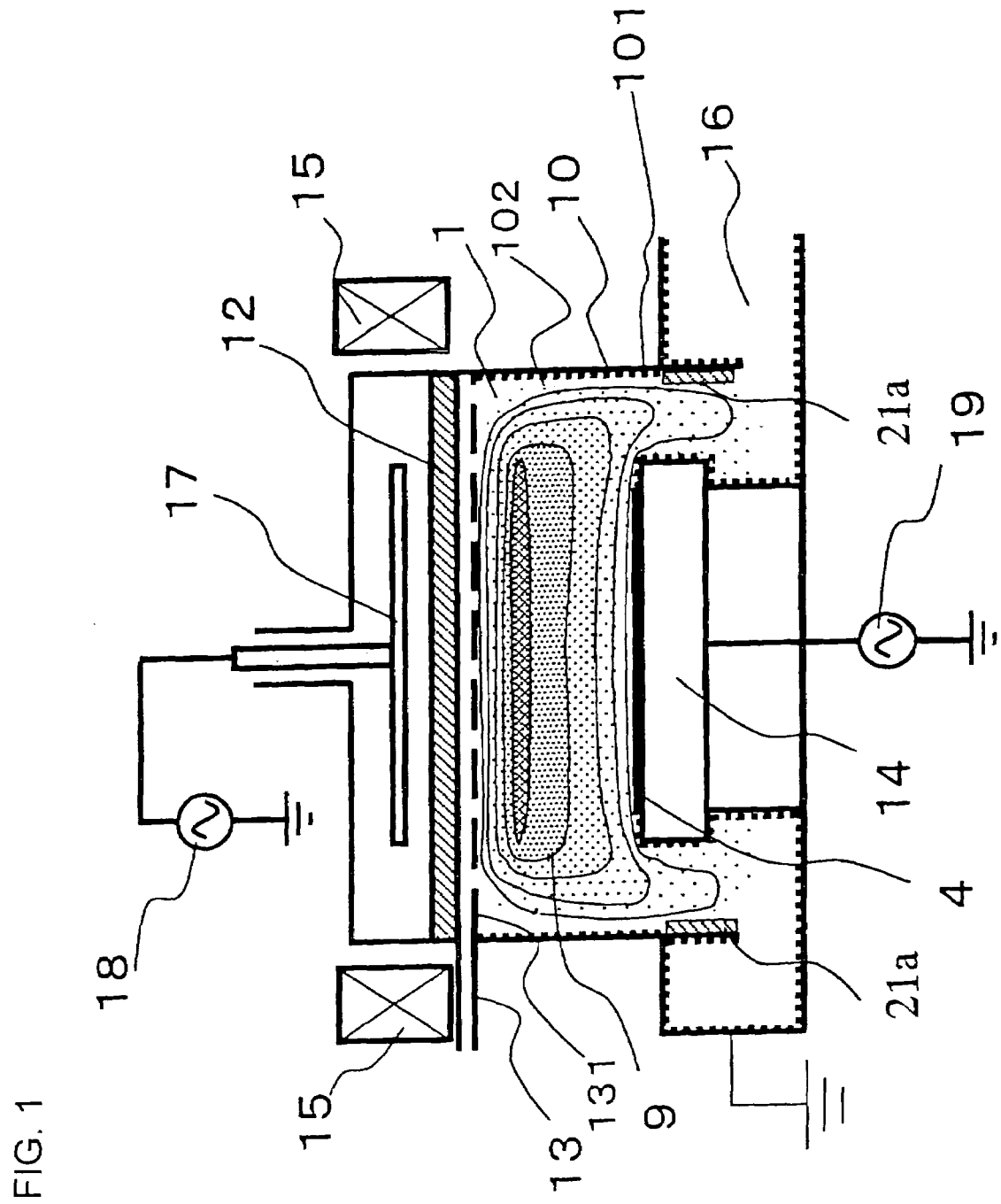
FIG. 1 is a schematic view showing the outline of a structure of a plasma processing apparatus according to the present invention.

We will now describe in detail a plasma etching apparatus utilizing electromagnetic waves in the UHF band, which is one example of the plasma processing apparatus according to a first preferred embodiment of the present invention with reference to FIG. 1. The plasma etching apparatus is composed of a reaction chamber container 10 defining a reaction chamber 1, a dielectric vacuum window 12, a gas discharge plate 13 having gas discharge holes 131, a wafer holding electrode 14 functioning as a substrate holder on which a wafer 4 is mounted, a field coil 15, an exhaust outlet 16 for maintaining the inside of the reaction chamber container 10 in decompressed state, a plasma-generating high-frequency electrode 17 to which high frequency is applied from a plasma-generating high-frequency power supply 18 for generating plasma 9 inside the reaction chamber, a wafer biasing high-frequency power supply 19 for supplying a biasing high-frequency power to the wafer holding electrode 14, and a conductive portion or member 21a electrically connected to the reaction chamber container 10 and functioning as a DC earth. The surface portion of an inner wall 101 of the reaction chamber container 10 which is exposed to the plasma is coated with insulating material 102.

The reaction chamber 1 for plasma processing includes, at the upper area thereof, a dielectric vacuum window 12 for introducing the UHF-band electromagnetic waves for generating plasma 9, and a gas discharge plate 13 made of dieletric material and having gas discharge holes 131 through which reactive processing gas is introduced, and the exhaust from the etching process containing reaction products is evacuated through the exhaust outlet 16 disposed at the bottom area of the reaction chamber 1. A protective coating formed of an insulating material (dielectric) 102 is disposed on the surface of the inner wall 101 of the reaction chamber container 10, which is formed by anodizing (providing alumite treatment to) the surface of an aluminum alloy base material. The wafer 4 to be etched is mounted on an electrostatic chuck not shown formed of a dielectric film disposed on the wafer holding electrode (substrate holder) 14, and the wafer 4 is chucked onto the holder by electrostatic force. Helium gas is filled between the wafer 4 and the electrostatic chuck film so as to ensure thermal transmission between the wafer and electrode 14 to thereby control the temperature of the wafer 4. A wafer-biasing high-frequency power supply 19 is connected to the wafer holding electrode 14 so as to apply bias high frequency to the wafer 4.

In order to perform etching, reactive gas is introduced to the reaction chamber 1 through the gas discharge plate 13 while retaining a pressure ranging typically between 0.5 Pa and 10 Pa, magnetic field is applied to the reaction chamber 1 through the field coil 15, and output from the plasma-generating high-frequency power supply 18 is applied through the plasma-generating high-frequency electrode 17 disposed on the upper area of the reaction chamber 1 into the reaction chamber 1, according to which plasma 9 is generated in the reaction chamber 1.

The gaseous species used for generating plasma can be selected according to the object of the process, and for example, if a Si-based etching process is to be performed, reactive gases such as $Cl_2$, HBr, $CF_4$ and $SF_6$ and gases such as $O_2$ and Ar are used in combination. These reactive gases react chemically with the conductive material such as aluminum alloy and stainless steel constituting the reaction chamber container 10, which may cause damage to the inner wall 101 of the chamber, and if the metallic compounds such as AlCl and AlF generated as chemical reaction products from the wall material enter the plasma and contaminate the circuit element formed on the wafer, the electric properties of the circuit element is affected and the performance thereof is deteriorated.

In order to prevent such metal pollution caused by the wall material, according to the present invention, the surface of the aluminum alloy is anodized so as to protect the area coming into contact with plasma with an alumite or anodized aluminum (dielectric coating) that is chemically stable. The area to which the protective coating is formed by anodizing aluminum must at least correspond to the area of the wall directly exposed to high-density plasma. From the aspect of reducing metal pollution, however, it is effective to provide a protective coating not only to a limited portion of the reaction chamber but to the whole inner wall surface including the exhaust port 16 to which diffused plasma can possibly come into contact with.

The magnetic field applied to the reaction chamber 1 functions not only to effectively retain the electrons in the plasma that are accelerated by the UHF-band high-frequency supplied from the high-frequency power supply 18 so as to enhance the plasma generation efficiency, but also to manipulate the conveyance of the generated plasma to the wafer location by controlling the shapes of magnetic lines of force and to adjust the plasma distribution. Regarding density distribution of plasma 9 within the reaction chamber 1, the plasma density is highest at the upper area of the reaction chamber 1 which is the plasma generating region, and along with the diffusion of plasma from the generation region toward the wall of the reaction chamber 1, the plasma density is reduced. At this time, if magnetic field is applied, the electrons and ions are not easily transported in the direction traversing the magnetic lines of force due to the Lorentz force operating thereto, so the plasma distribution at the downstream area near the electrode 14 and the inner wall 101 of the reaction chamber depend greatly on the magnetic field configuration.

Figure 2:
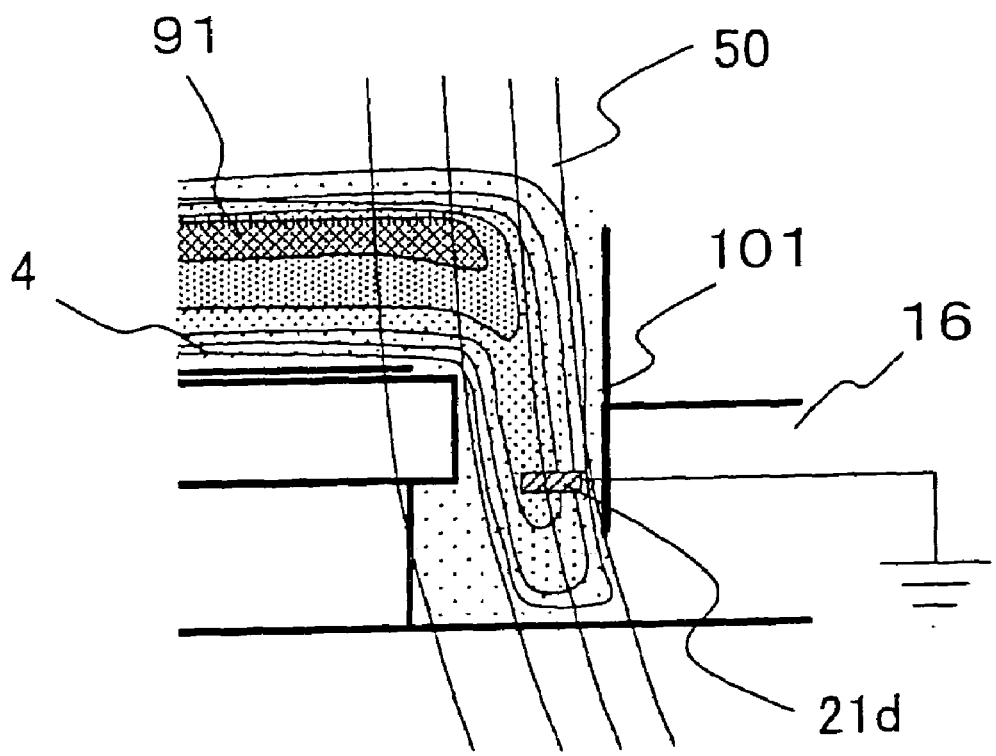
FIG. 2 is an explanatory view showing the mounting position of a conductive member.

With reference to FIG. 2, the status of distribution of the plasma density within the reaction chamber 1 is explained in detail. The contour 91 of plasma 9 illustrates an outline of how the plasma density is distributed when a magnetic field exists. The variation of plasma density is small along the magnetic lines of force 50 generated by the field coil 15, and the variation of plasma density is great in the direction traversing the magnetic lines of force 50. The potential distribution in the plasma corresponds substantially to this density distribution, wherein the potential difference is small along the magnetic lines of force, and the potential difference is great in the direction traversing the magnetic lines of force. According to the examples illustrated in FIGS. 1 and 2, the conductive members 21a and 21d are disposed in the areas where the plasma density and plasma potential are higher compared to those at the side wall of the inner wall 101 of the reaction chamber 1. That is, according to FIG. 1, the conductive member is disposed at a position where the potential is substantially equal to the plasma potential at the side wall of the inner wall 101, and according to FIG. 2, the conductive member 21d is disposed to reach a position where the potential is higher than the plasma potential at the side wall of the inner wall 101. As for the shape and position of the conductive member 21, it is also possible to dispose a single rectangular conductive member near the substrate holder. However, if the process requires a highly accurate symmetric property, it is effective to dispose plural conductive members 21 at positions surrounding the substrate holder at equal distances or to dispose a ring-shaped conductive member 21 surrounding the substrate holder. The conductive member 21 is disposed so that the conductive material thereof comes into direct contact with plasma so as to enable direct current to flow therein from the plasma, and the conductive member is either connected to the earthed reaction chamber container 10 made of conductive metal or earthed through a wire connection so as to allow the incoming direct current to flow to the earth.

The DC earth is disposed where the plasma floating potential is higher than the plasma floating potential at the inner wall 101 near the substrate holder (wafer holding electrode) where much of the high-frequency current applied to the substrate holder flows and causes chipping of walls. Thus, the floating potential of plasma near the surface of the inner wall 101 is reduced to either ground potential or negative potential by the DC earth, and sputtering by ions is suppressed. The area of the inner wall or earth through which high-frequency current flows vary according to the plasma generation method, the shape of the reaction container 10 and the wall material, so it is necessary to optimize the location of the DC earth to correspond to the position where sputtering must be suppressed. Further, by applying a magnetic field to the plasma, manipulating the field configuration thereof and controlling the plasma potential distribution (density distribution), the effect of the DC earth can be further optimized.

Figure 3:
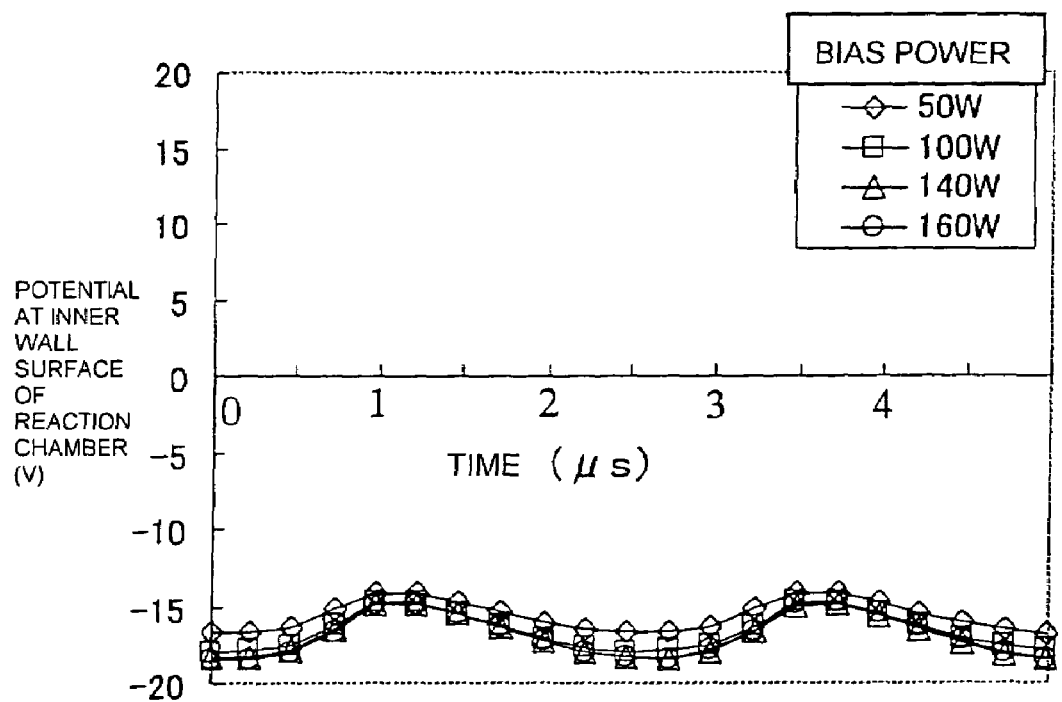
FIG. 3 is a graph showing surface potential waveforms measured at the inner wall of the reaction chamber equipped with a conductive member according to the present invention.
Figure 6:
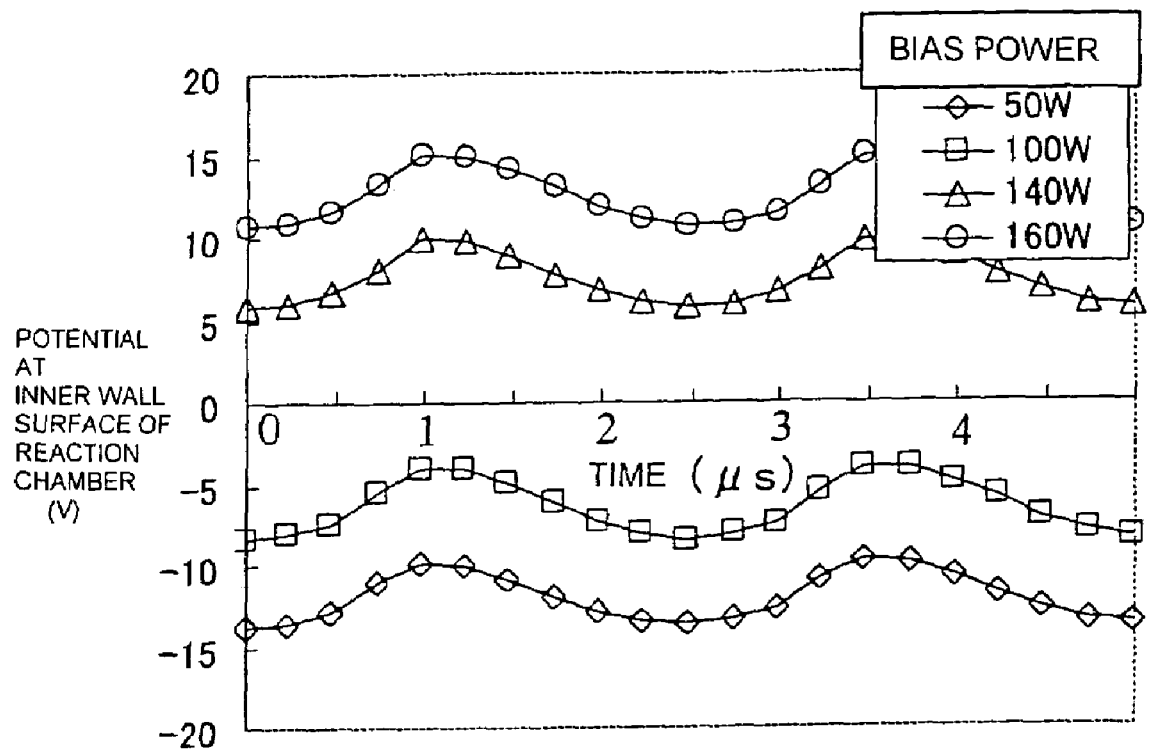
FIG. 6 is a graph showing surface potential waveforms measured at the inner wall of the reaction chamber that is not equipped with the conductive member.
Figure 7:
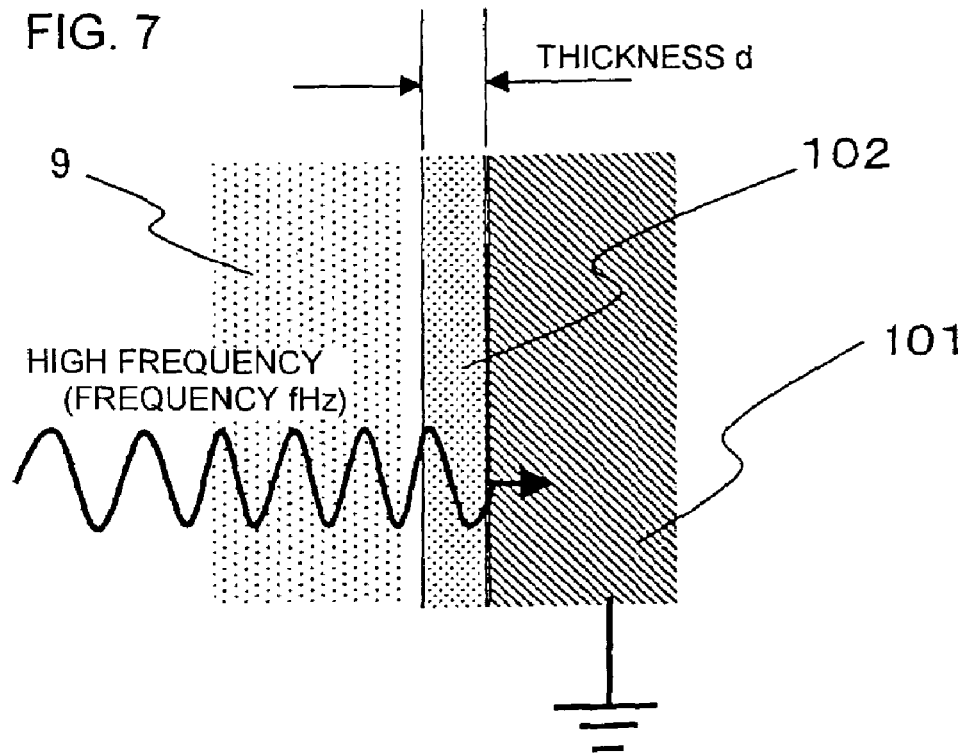
FIG. 7 is an explanatory view showing the function of a dielectric protective coating disposed on the inner wall of the reaction chamber.
Figure 8:
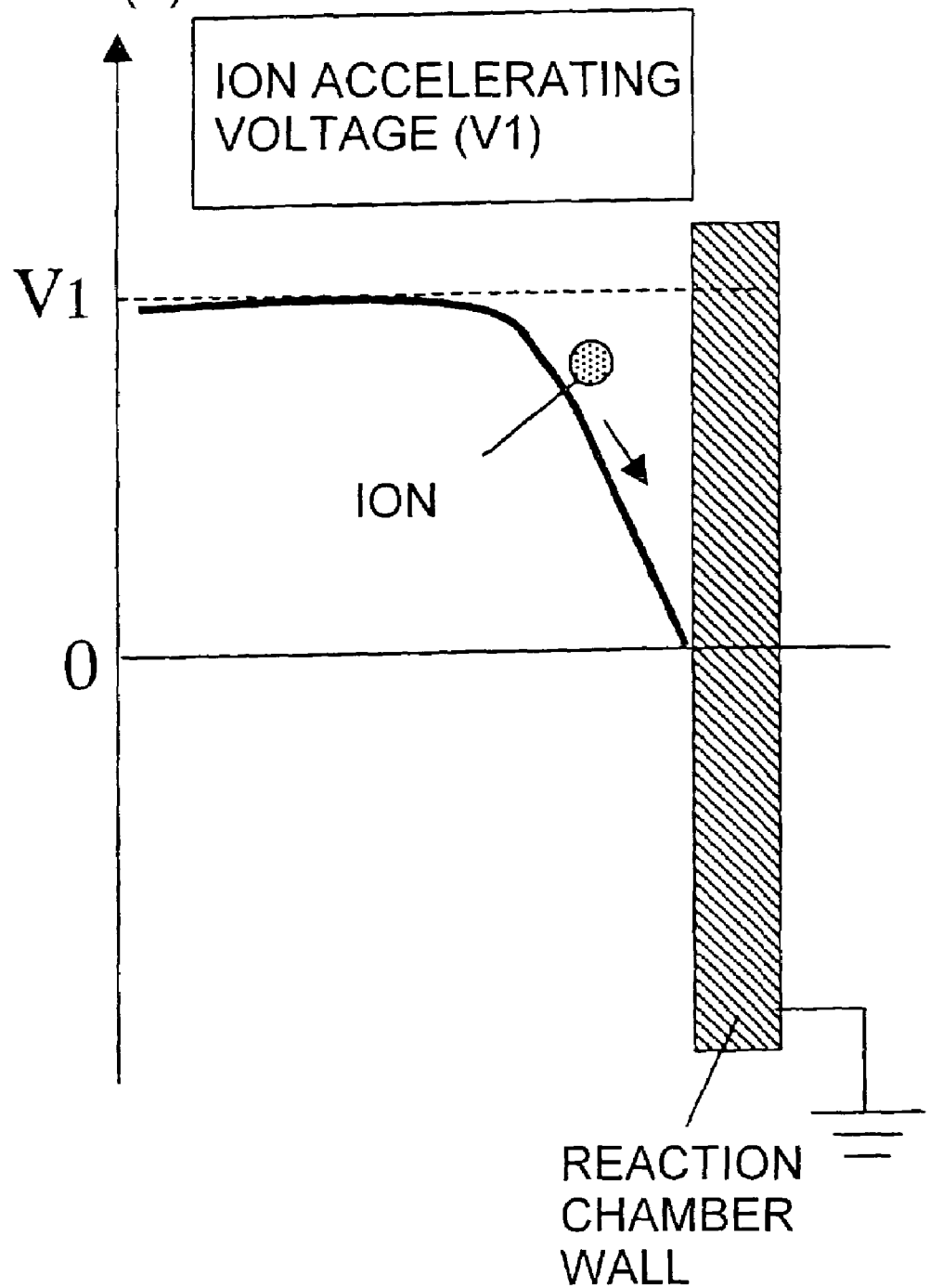
FIG. 8 is an explanatory view showing the relationship between the plasma potential and ion sputtering.
Figure 9:
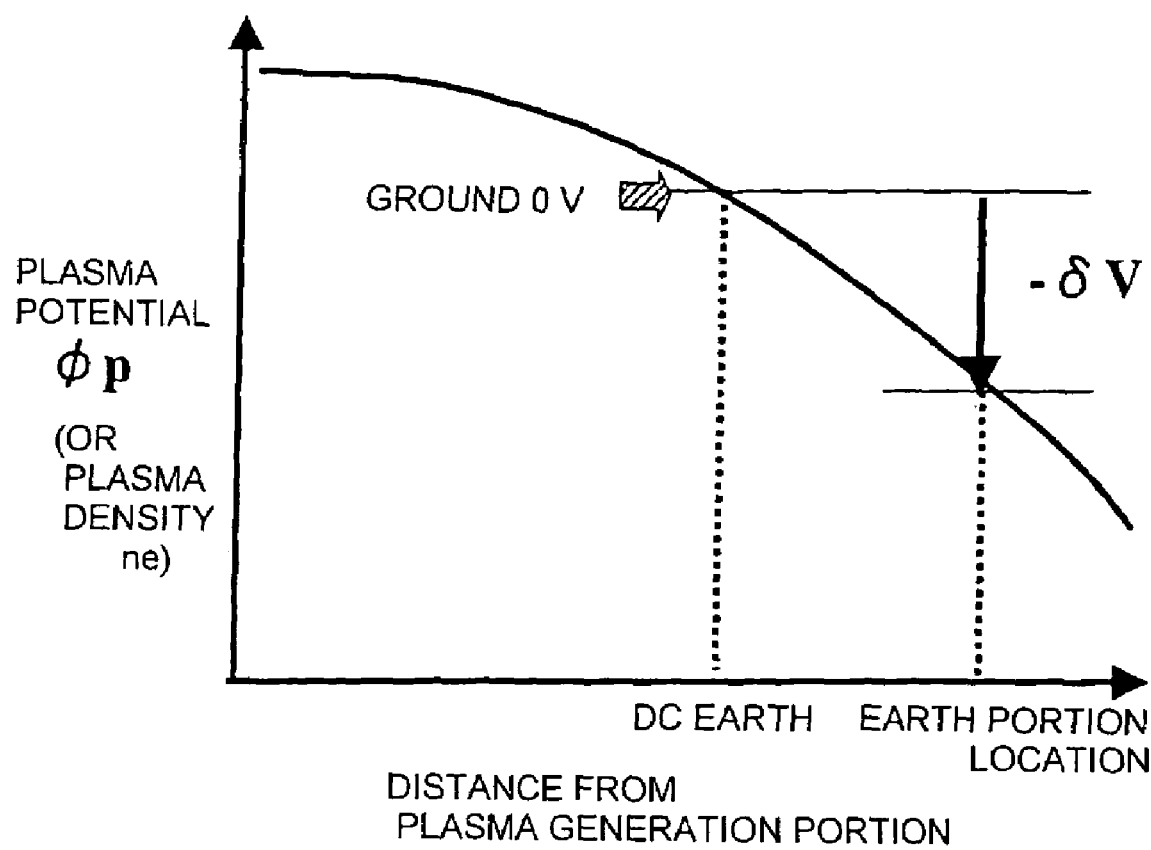
FIG. 9 is an explanatory view showing the plasma potential distribution.

The result of measuring using an oscilloscope the potential waveforms at the side wall surface of the inner wall 101 of the reaction chamber 1 having the structure illustrated in FIG. 1 are illustrated in FIG. 3 and FIG. 6. The measurement of the potential was performed on the side wall of the inner wall 101 at an intermediate height between the wafer 4 and the gas discharge plate 13 separated with a distance of 100 mm. In this measurement, $CF_4$ gas was used as discharge gas, pressure was set to 2 Pa, and discharge power was set to 500 W. The bias high frequency applied to the wafer 4 with a diameter of 300 mm had a frequency of 400 kHz, and the power thereof was varied from 50 W to 160 W. If a conductive member 21 functioning as the DC earth was not provided, as shown in FIG. 6, the measured inner wall surface potential was varied for approximately 5 V with the frequency of the bias high frequency applied to the wafer, and the direct current potential was changed greatly along with the bias power. The level of variation of direct current potential in this case was changed in the range between approximately −12 V and 14 V, and the potential variation was approximately 26 V. In general, the threshold energy of ion sputtering is approximately over 10 V, so a potential variation of approximately 26 V increases ion sputtering.

FIG. 3 illustrates an example where the conductive member 21a is disposed inside the reaction chamber 1. In the measurement, the conductive member 21a used experimentally was a stainless steel sheet (0.1 t) having an area size of 50 mm×60 mm, and was located at the position illustrated in FIG. 1. The conductive member 21a was retained on the surface of the alumite 102 at the lower end of the side surface of the inner wall 101 of the reaction chamber 1 not shown in FIG. 1, and was earthed through a cable. Thus, when the plasma is earthed through the conductive member 21a disposed at a position illustrated in FIG. 1, the surface potential on the inner wall 101 of the reaction chamber 1 varies for substantially 5 V at 400 kHz, but the variation of direct current potential caused by the bias high-frequency power as shown in FIG. 6 is suppressed, so that not only the variation is reduced greatly, but also the overall potential waveform is maintained at negative potential. As a result, the ion-accelerating potential difference from the plasma can be reduced, by which the chipping of the walls is suppressed and the metal contamination caused by the wall material is prevented.

A protective coating made of insulative ceramic such as carbide, oxide or nitride (for example, SiC, boron carbide and alumite) that are chemically stable materials, are utilized as protective coating (dielectric coating) 102 on the inner wall 101 of the reaction chamber. The relationship between the coating thickness d, the frequency f of the plasma-generating high-frequency applied to the substrate 4 and the dielectric constant $\in$ of the dielectric is determined so that the impedance per unit area $R=d/(2\pi f\in)$ when the above-mentioned high frequency is propagated through the dielectric portion by capacity coupling is 100 Ω or smaller. Thus, with respect to high frequency, the impedance R of the protective coating can be reduced, and the property as the earth is not deteriorated. As a result, even when the inner wall of the reaction chamber is covered with protective coating, the impedance of the protective coating against the high frequency current flowing in through the walls or into the earth is increased, by which the increase of plasma potential variation can be suppressed and the chipping of walls by ion sputtering can be prevented.

Figure 4:
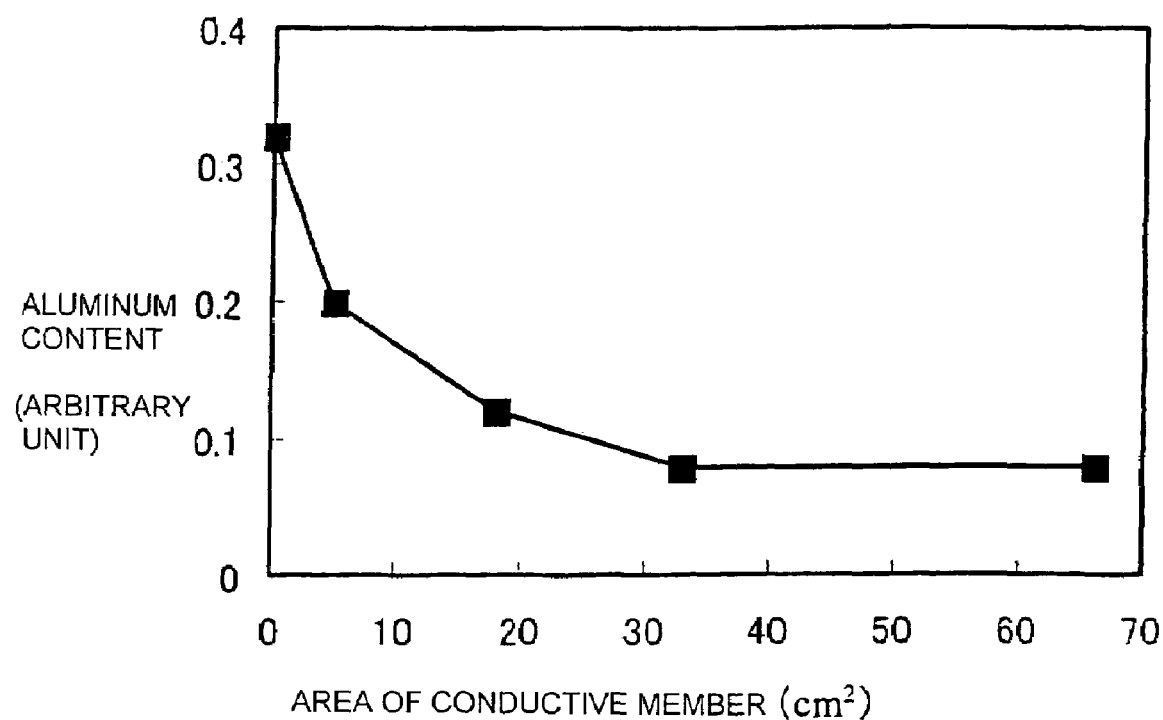
FIG. 4 shows the relationship between the aluminum content of the deposition in the reaction chamber and the area of the conductive member.

The mixing in of metal to the plasma was evaluated by the aluminum content in the deposition adhered to the gas discharge plate 13 made of quartz disposed at the upper portion of the reaction chamber. When the aluminum from the aluminum alloy material forming the wall is mixed into plasma, it reacts with the fluorine-based gas used widely in etching processes, forming a chemically stable AlF compound that tends to be deposited inside the reaction chamber 1 as deposit and causes contamination. Therefore, with the aim to reduce the amount of Al contained in the deposit, the areas of the conductive members 21 constituting the DC earth were varied to test how the chipping of walls was reduced thereby, the result of which is shown in FIG. 4. As shown in FIG. 4, the amount of Al contained in the deposit was reduced in inverse proportion to the area of the conductive member 21. Regarding the effect of reducing the amount of Al, the aluminum content was reduced by approximately ⅓ when the DC earth area was 5 cm², while the content was reduced by approximately ⅔ when the earth area was 33 cm², showing a tendency to saturate. According to the present experiment, it was discovered that the required DC earth area was approximately 5 cm² or greater and 33 cm² or smaller. The area of the conductive member described here corresponds to approximately 0.3% to 2.5% of the whole sidewall area of the reaction chamber 1. Therefore, in general, chipping of the side walls can be effectively suppressed by providing a conductive member with an area corresponding to approximately 0.3% to 2.5% of the sidewall area that functions as an effective earth for the bias high frequency. However, when considering the difference in effects resulting between the various equipment configurations, such as between a parallel plate plasma equipment and an induction RF plasma equipment, it is considered desirable to provide a conductive material having an area of less than approximately 10% of the whole reaction chamber wall area to function as the effective earth for high frequency to obtain advantageous-results without fail. However, even if it is impossible to acquire a large DC earth area, it is still possible to expect an Al content cut-down effect of approximately 1/10 with a DC earth area corresponding to 0.1% of the whole reaction chamber wall area.

According to some plasma processing conditions, etching reaction byproducts or deposition caused by CVD processes are deposited on the surface of the DC earth, inhibiting the flow of direct current to the DC earth, and sometimes even disabling the function of the earth for the direct current when the amount of deposition is excessive. Conventionally, when performing an Si-based etching process, a mixed gas of Si and chlorine or HBr is used. By adding thereto a fluorine-based gas (such as $SF_6$) having the effect to remove Si-based reaction byproducts, the deposition of Si-based reaction byproducts to the DC earth surface can be suppressed, and the functions of the DC earth can be maintained stably. It is also effective to perform a normal etching process to one or more wafers before generating plasma using the mixed gas of fluorine-based gas or chlorine-based gas to remove the deposition on the DC earth surface in order to maintain the effects of the DC earth.

Figure 5C:
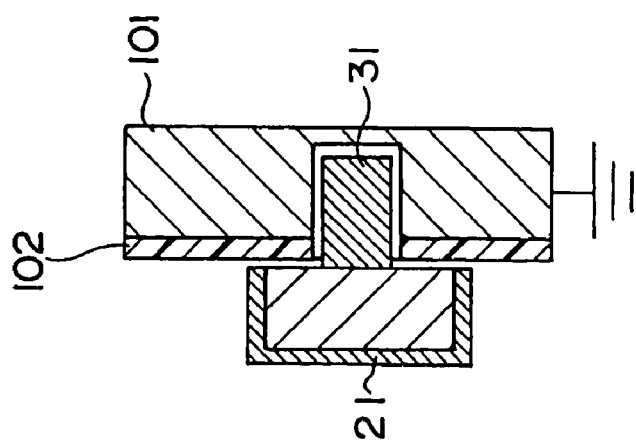
FIG. 5 is an explanatory view showing how the conductive members is mounted.
Figure 5B:
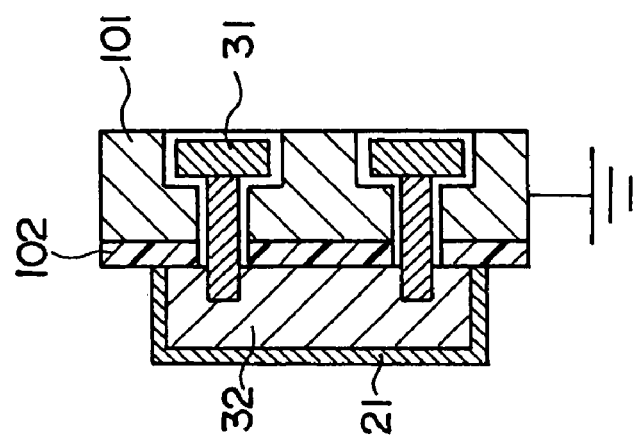
Figure 5A:
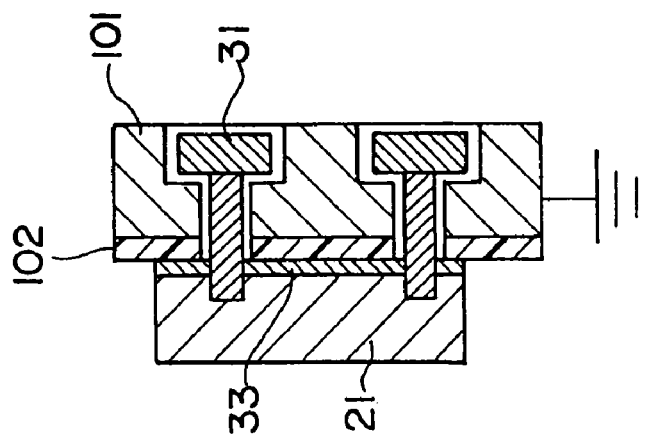

The embodiments concerning the structure of the conductive member 21 are shown in FIG. 5. Conductive ceramic or SiC and the like are preferable as the material for forming the conductive member 21 considering the resistance to reactive gas such as chlorine-based gas. One effective method of mounting the conductive member 21 to the reaction chamber is illustrated in FIG. 5(a), in which a conductive member 33 having good contact property to both the reaction chamber container 10 and the conductive member 21 is deposited on the mounting surface by evaporation or the like in order to assure a good electric contact between the conductive member 21 and the surface of the earthed reaction chamber inner wall 101, and a screw 31 formed of conductive material is used to mount the conductive member 21 to the mounting surface.

Another example is shown in FIG. 5(b), in which a conductive member 21 is formed by depositing SiC or conductive ceramic via CVD or thermal spraying to the surface of a metallic conductive member 32 coming into contact with plasma, and fixing the conductive member 21 on the reaction chamber inner wall 101 with screws 31 formed of conductive material. According to this example, a protective coating against reactive gas is formed, and the earth can maintain its function stably for a long time.

Another example is shown in FIG. 5(c), in which a conductive protective coating 21 is formed to the portion of a metallic conductive material screw 31 coming into contact with plasma, and mounting the screw onto the inner wall 101 of the reaction chamber, thereby providing a small, inexpensive conductive member 21 that can be mounted easily to the desired location.

According to the mounting method illustrated in FIG. 5(a), it is necessary that the area of the inner wall 101 on which the conductive member 21 is mounted is not covered with insulating material since a conductive material 33 is deposited thereon, but according to the methods illustrated in FIGS. 5(b) and 5(c), the conductive member 21 and the inner wall 100 of the reaction chamber are communicated via a conductive screw 31, so there is no problem even if the surface of the inner wall 100 of the reaction chamber is covered with insulating material.

As described above, when the base material of the DC earth is not metal, such as conductive ceramic, SiC, Al and Al compound, the earth resistance of the DC earth can be reduced by interposing on the mounting surface of the DC earth a conductive material with a dielectric constant of 1 Ωcm or less via evaporation, spraying, sandwiching or the like. Furthermore, the present invention can be applied not only to the plasma processing apparatuses as described above, but also to processing apparatuses that generates plasma within a reaction chamber by applying high frequency and then applies a second high frequency to a substrate holder on which a substrate is mounted to control the ion energy to the substrate and to provide plasma processing to the substrate, the apparatus having its inner wall surface covered with insulating material so as to prevent the inner wall of the chamber from being sputtered by plasma and contaminating the processed substrate.

What is claimed is:

1. A plasma processing apparatus for processing a substrate with plasma by applying a high frequency to a reaction chamber so as to generate plasma therein, and applying a second high frequency to a substrate holder on which the substrate is placed so as to control the ion energy to the substrate; wherein
    a dielectric that is exposed to the plasma substantially covers a surface portion of an inner wall of the reaction chamber, an electrically conductive member is disposed within the reaction chamber so as to be exposed to the plasma within the reaction chamber at a position with respect to the inner wall of the reaction chamber which is covered with the dielectric, and the electrically conductive member is electrically coupled to earth one of directly and through the inner wall of the reaction chamber so as to form a DC earth which enables direct current to flow therein from the plasma, the electrically conductive member has an area in a range of 0.1% to 10% of the inner wall area of the reaction chamber, a magnetic field generation means is disposed outside of the reaction chamber so as to apply a magnetic field to the plasma, and the electrically conductive member forming the DC earth is disposed at a position crossing a magnetic line of force that is closer to the substrate holder than a magnetic line of force that crosses the inner wall of the reaction chamber having the dielectric thereon.

2. The plasma processing apparatus according to claim 1, wherein
    the dielectric covers 90% or more of a total surface area of the inner wall of the reaction chamber.

3. The plasma processing apparatus according to any one of claims 1 and 2, wherein
    the electrically conductive member forming the DC earth is located at a position within the reaction chamber where a floating potential of plasma is substantially equal to or greater than a floating potential of the plasma at the inner wall of the reaction chamber covered with the dielectric with respect to the high frequency or the second high frequency.

4. The plasma processing apparatus according to any one of claims 1 and 2, wherein
    the dielectric is a protective coating formed of insulating ceramic such as carbide, oxide or nitride, as exemplified by SiC, boron carbide and alumite, and a thickness d of the dielectric coating is determined so that, with respect to the relationship between frequency f of the high frequency applied to the substrate and the dielectric constant $\in$ of the dielectric, an impedance per unit area $R = d/(2\pi f\in)$ when high frequency is propagated by capacitive coupling through the dielectric is 100Ω or smaller.

5. The plasma processing apparatus according to any one of claims 1 and 2, wherein
    either a base material of the electrically conductive member forming the DC earth or a protective coating disposed on a surface of the electrically conductive member forming the DC earth and coming into contact with the plasma is composed of conductive ceramic, SiC, Al or Al compound.

6. The plasma processing apparatus according to any one of claims 1 and 2, wherein
    when a base material of the electrically conductive member forming the DC earth is composed of a non-metallic material such as conductive ceramic, SiC, Al or Al compound, a conductive part having a conductivity σ of 1 Ωcm or less is provided to a surface of the base material by evaporation, spraying or interposing, thereby reducing an earth resistance of the electrically conductive member forming the DC earth.

7. The plasma processing apparatus according to claim 3, wherein
    the dielectric is a protective coating formed of insulating ceramic such as carbide, oxide or nitride, as exemplified by SiC, boron carbide and alumite, and a thickness d of the dielectric coating is determined so that, with respect to the relationship between frequency f of the high frequency applied to the substrate and the dielectric constant s of the dielectric, an impedance per unit area $R = d/(2\pi f\in)$ when high frequency is propagated by capacitive coupling through the dielectric is 100Ω or smaller.

8. The plasma processing apparatus according claim 3, wherein
    either a base material of the electrically conductive member forming the DC earth or a protective coating disposed on a surface of electrically conductive member forming the DC earth coming into contact with the plasma is composed of conductive ceramic, SiC, Al or Al compound.

9. The plasma processing apparatus according to claim 3, wherein
    when a base material of the electrically conductive member forming the DC earth is composed of a non-metallic material such as conductive ceramic, SiC, Al or Al compound, a conductive part having a conductivity σ of 1 Ωcm or less is provided to a surface of the base material by evaporation, spraying or interposing, thereby reducing an earth resistance of the electrically conductive member forming the DC earth.

10. The plasma processing apparatus according to claim 1, wherein the electrically conductive member is disposed within the reaction chamber and is electrically coupled to earth by a wire extending through the inner wall of the reaction chamber.

11. The plasma processing apparatus according to claim 1, wherein the electrically conductive member is positioned in the reaction chamber so as to enable suppression of chipping of the surface portion of the inner wall of the reaction chamber.

* * * * *